United States Patent [19]
Onishi et al.

[11] Patent Number: 5,592,000
[45] Date of Patent: Jan. 7, 1997

[54] NON-VOLATILE SEMICONDUCTOR MEMORY DEVICE PROGRAMMABLE AND ERASABLE AT LOW VOLTAGE

[75] Inventors: Katsunori Onishi; Fuchia Shone, both of Hsinchu, Taiwan

[73] Assignee: Macronix International Co., Ltd., Hsinchu, Taiwan

[21] Appl. No.: 356,079

[22] Filed: Jan. 25, 1995

[51] Int. Cl.$^6$ .................... H01L 29/788; H01L 27/10; G11C 11/34
[52] U.S. Cl. .......................... 357/315; 259/208
[58] Field of Search ................... 257/315, 208; 365/900, 185, 230.03, 230.06

[56] References Cited

U.S. PATENT DOCUMENTS

| | | | |
|---|---|---|---|
| 4,258,378 | 3/1981 | Wall | 257/316 |
| 4,639,893 | 1/1987 | Eitan | 365/185 |
| 4,698,787 | 10/1987 | Mukherjee et al. | 365/185 |
| 4,780,424 | 10/1988 | Holler et al. | 257/316 |
| 4,792,925 | 12/1988 | Corda et al. | 365/185 |
| 4,947,378 | 8/1990 | Jinbo et al. | 365/222 |
| 4,949,309 | 8/1990 | Rao et al. | 365/185 |
| 4,972,378 | 11/1990 | Kitigawa et al. | 365/185 |
| 5,023,681 | 6/1991 | Ha | 365/230.03 |
| 5,023,837 | 6/1991 | Schreck et al. | 365/185 |
| 5,028,979 | 7/1991 | Mazzali | 257/316 |
| 5,045,489 | 9/1991 | Gill et al. | 437/43 |
| 5,060,195 | 10/1991 | Gill et al. | 365/185 |
| 5,095,461 | 3/1992 | Miyakawa et al. | 365/185 |
| 5,110,753 | 5/1992 | Gill et al. | 365/185 |
| 5,111,428 | 5/1992 | Liang et al. | 365/51 |
| 5,127,739 | 7/1992 | Duvvury et al. | 365/205 |
| 5,168,335 | 12/1992 | D'Arrigo et al. | 365/185 |
| 5,204,835 | 4/1993 | Eitan | 365/185 |
| 5,229,968 | 7/1993 | Ito et al. | 365/210 |
| 5,245,570 | 9/1993 | Fazio et al. | 365/185 |
| 5,315,541 | 5/1994 | Harari et al. | 365/63 |

FOREIGN PATENT DOCUMENTS

| | | |
|---|---|---|
| 0298430A2 | 1/1989 | European Pat. Off. . |
| 0422347A2 | 9/1989 | European Pat. Off. . |
| 0354858A1 | 2/1990 | European Pat. Off. . |
| 0461764A2 | 6/1990 | European Pat. Off. . |
| 0386631A2 | 9/1990 | European Pat. Off. . |
| 0461764A3 | 12/1991 | European Pat. Off. . |
| 0552531A1 | 7/1993 | European Pat. Off. . |
| 2241380 | 11/1990 | United Kingdom . |

OTHER PUBLICATIONS

M. Okada, et al., "16 Mb ROM Design using Bank Select Architecture" IEEE Symposium on VLSI Circuits, Tokyo, 1988.

W. Kammerer, et al., "A New Virtual Ground Array Architecture for Very High Speed, High Density EPROMS", IEEE Symposium on VLSI Circuits, OISO, May 1991, pp. 83–84.

Eitan, et al., "Alternate Metal Virtual Ground (AMG)–A New Scaling Concept for Very High–Density EPROM's"; IEEE Electron Device Letters, vol. 12, No. 8, Aug. 1991, pp. 450–452.

(List continued on next page.)

*Primary Examiner*—Stuart S. Levy
*Assistant Examiner*—Odriana Giordana
*Attorney, Agent, or Firm*—Haynes & Davis

[57] ABSTRACT

A non-volatile semiconductor memory device is implemented in a manner which allows programming and erasing at low voltage. The non-volatile semiconductor memory device includes a plurality of blocks, each including a plurality of wordlines acting as control gates, buried diffusion layers acting as sources and drains, metal lines arranged one for every two buried diffusion layers, and memory cells formed between the two buried diffusion layers. Block transistors are connected to both ends of the buried diffusion layers for connecting the buried diffusion layers to the corresponding metal lines. The buried diffusion layers of each block are connected through the block transistors in the form of a bellows.

3 Claims, 4 Drawing Sheets

OTHER PUBLICATIONS

H. Pein, et al., "A 3-D Sidewall Flash EPROM Cell and Memory Array"; IEEE Electron Device Letters, vol. 14, No. 8, Aug. 1993, pp. 415–417.

H. Pein, et al., "Performance of the 3-D Sidewall Flash EPROM Cell"; IEEE, 1993.

S. Yamada, et al., "Degradation Mechanism of Flash EEPROM Programming After Program/Erase Cycles"; IEEE 1993.

H. Kume, et al., "A 1.28 µm² Contactless Memory Cell Technology for a 3V-Only 64Mbit EEPROM"; IEDM 1992.

A. Bergemont, et al., "NOR Virtual Ground (NVG)–A New Scaling Concept for Very High Density FLASH EEPROM and its Implementation in a 0.5 µm Process"; IEEE, 1993.

H. Onoda, et al., "A Novel Cell Structure Suitable for a 3 Volt Operation, Sector Erase and Flash Memory"; IEEE, 1992.

R. Kazerounian, et al., "Alternate Metal Virtual Ground EPROM Array Implemented in a 0.8 µm Process for Very High Density Applications"; IEEE 1991, pp. 11.5.1–11.5.4.

M. McConnell, et al., "An Experimental 4-Mb Flash EEPROM with Sector Erase" Journal of Solid Circuits, vol. 26, No. 4; Apr. 1991; pp. 484–489.

B. J. Woo, et al., "A Novel Memory Cell Using Flash Array Contactless EPROM (FACE) Technology"; IEEE 1990; pp. 5.1.1–5.1.4.

B. J. Woo, et al., "A Poly-Buffered FACE Technology for High Density Flash Memories" Symposium on VLSI Technology, pp. 73–74.

NON-VOLATILE SEMICONDUCTOR MEMORY DEVICE PROGRAMMABLE AND ERASABLE AT LOW VOLTAGE

BACKGROUND OF THE INVENTION

1. Field of the Invention

The present invention relates to a non-volatile semiconductor memory device and an operating method therefor, and more particularly to an electrically programmable metal-oxide-semiconductor (MOS) type read only non-volatile semiconductor memory device and an operating method therefor.

2. Description of Related Art

Generally, in a semiconductor memory device such as a read only memory (which is hereinafter referred to as a ROM) or the like, high-density formation is required, and for this requirement, a virtual ground structure of a non-volatile semiconductor memory device is conventionally proposed. The virtual ground type memory structure is a known technique capable of enhancing the integration density of memory cells in an array while maintaining compatibility with the n-channel process and a two-layered gate electrode structure formed of ordinary two-layered polysilicon.

An EPROM (Erasable and Programmable ROM) of virtual ground structure shown in FIGS. 3 and 4 is published in IEEE Electron Device Lett, vol. 12, p. 450, 1991 and the array structure proposed in the cited publication is made such that one metal bit line is arranged for two interconnection layers formed of buried diffusion layers of virtual ground structure, and a memory cell is selected by use of an adequately arranged selection transistor. In this array structure, as a typical example, the EPROM cell is programmed by applying 12 V to the gate, applying 7 V to the drain, grounding the semiconductor substrate and source, and injecting channel hot electron into the floating gate.

The conventional non-volatile semiconductor memory device and the operating method therefor are explained below with reference to FIGS. 3 and 4.

FIG. 3(a) shows an equivalent circuit of the EPROM. FIG. 4 is a plan view showing the outline of the arrangement of the non-volatile semiconductor memory device. FIG. 4(b) is a cross sectional view taken along the line X–Y of the above plan view, and the same symbols are attached to the same portions.

FIG. 3(a) shows a plurality of memory transistors (which are hereinafter simply referred to as memory cells) 1, 1a, 1b each having a floating gate 2, and the control gates thereof are connected to a word line 3. Buried diffusion layers (bit lines) 5, 5a function as drains for all of the memory cells and buried diffusion layers (bit lines) 4, 4a, 4b function as sources.

Each memory cell includes the floating gate 2, the control gate 3 connected to the word line, and buried diffusion layers functioning as the source and drain, and the non-volatile semiconductor memory device is constructed by two bit lines 4 and 5, formed of buried diffusion layers, a metal line 6 arranged for every two bit lines, selection transistors 7 and 8, and selection lines 9 and 10 connected to the gates of the selection transistors 7 and 8.

The arrangement of the array structure of the non-volatile semiconductor memory device of FIG. 3 is shown in the plan view of FIG. 4(a), memory cells are arranged in a matrix form, and FIG. 4(b) shows the cross section of the array structure. The buried diffusion layers 4, 5, 4a, 5a are formed in parallel and covered with an insulation layer. The word lines 3 are arranged to intersect the buried diffusion layers at right angles. Generally, the word line 3 is formed of a conductive polysilicon layer.

Further, it is known that in the conventional flash memory of array structure which is the array structure other than the so-called virtual ground structure, both of the programming and erasing operations can be attained by use of a single power supply of low voltage by using a Fowler-Nordheim tunnel current. Particularly, in the array structure called a NOR type, the function of the flash memory can be provided by the programming and erasing operations by the Fowler-Nordheim tunnel current by defining a state in which excessive electrons are stored in the floating gate, that is, a state in which the threshold value is as high as the erasing state.

That is, in order to lower threshold value or to program the memory cell set in the erasing state in which the threshold value thereof is high, a power supply voltage of 5 V, 3.3 V or the like is applied to one of the drain and source, the other electrode is set in the floating state, the semiconductor substrate is grounded and a negative voltage is applied to the gate. Under this condition, a high voltage is applied to a gate oxide film at one end of the drain or source so that the electrons stored in the floating gate can be drawn as a tunnel current, thereby lowering the threshold value of the memory cell and programming the memory cell. At this time, it is important that a desired memory cell can be independently selected by adequately selecting the word line and bit line.

Further, since consumed current is smaller in the programming by the Fowler-Nordheim tunnel current than in the programming operation by channel hot electron, it is possible to independently select the bit lines of a group of memory cells which commonly have a selected word line as a control gate and effect the programming operation in parallel.

Further, the erasing operation can be effected by applying a high voltage to the gate and grounding the semiconductor substrate or applying a negative voltage thereto so as to cause a tunnel current via the gate oxide film of the channel portion, inject excessive electrons into the floating gate, and enhance the threshold value. This operation is simultaneously effected for the whole chip or for all of the memory devices in the block, thereby making it possible to provide the function of the flash memory.

At present, the power supply for electronic devices tends to be provided by a single power supply of low voltage of 5 V or 3.3 V, and in this situation, there is a problem in the EPROM or flash memory using the virtual ground type array structure as shown in FIG. 3(a). That is, when the programming of the virtual ground type array structure is effected by channel hot electrons, a high voltage is applied as a voltage applied to the drain and a large current is required. Virtual ground type flash memory it has a disadvantage that it is not suitable for usage of the single power supply of low voltage (5 V or 3.3 V).

Further, in the array structure of FIG. 3(a), the bit line 4 always functions as a source for each memory cell and the bit line 5 functions as a drain, and it is impossible to effect the programming or erasing operation by the Fowler-Nordheim with the above symmetry being kept.

For example, when the memory cell in 1b is to be programmed, it is necessary to apply a power supply voltage to the bit line 5a and apply a negative voltage to the word line 3, but this condition is simultaneously applied to a memory cell 1c which lies in position symmetrical to the memory cell 1b via the bit line 5a as the programming condition.

Likewise, when the programming is effected by applying a potential to the source 4a of the memory cell 1b, the potential is also applied to the source of the memory cell 1a and it is impossible to separately program the two adjacent cells.

It is impossible to effect the programming by the tunnel current while the memory cells are kept in the symmetrical relation. Assume now that the bit line 4a shown in FIG. 3(b) functions as a drain for the memory cell 1a and functions as a source for the memory cell 1b, and that the arrangements of the drains and sources of respective memory cells have the symmetry in which the sources and drains are all made in the same direction as shown in FIG. 3(b). In order to program the memory cell 1a, a power supply voltage is applied to the bit line 4a and a negative voltage is applied to the word line 3. The bit line 4a applies a voltage to the memory cell 1b, but since it is connected to the source of the memory cell 1b, it is possible to independently program the memory cell 1a.

However, in order to program the memory cell 1b, it is necessary to apply a power supply voltage to the bit line 5a on the drain side thereof, but since the bit line 5a is not directly connected to a metal line, the power supply voltage must be supplied from the metal line 6a or 6b via the selection transistor 7 or 8. That is, in this case, a voltage is applied to the bit line 4a or 4b to set up the programming condition for the memory cell 1a or 1c. Therefore, it is impossible to independently program all of the memory cells. In the virtual ground array structure, since the potential of the metal line 6 is always applied to the buried diffusion layer 4 irrespective of the state of the selection transistor, it is impossible to independently select the buried diffusion layer 5. That is, in the non-volatile semiconductor device of FIG. 3(a), it is impossible to effect the programming by the tunnel current.

That is, the bit lines formed of the buried diffusion layer in the array structure include bit lines which are directly connected to the metal line and bit lines which are connected to the metal line via the selection transistor. In order to program the memory cell by the method using the tunnel current, a potential must be independently applied to the memory cell. However, in this array structure, when a potential is applied to the bit line 5, the same potential is inevitably applied to at least the bit line 4 and it is impossible to independently program the memory cells.

Further, not only in the EPROM or flash memory, but also in general, a leakage current caused at the readout time should be given as a problem of the memory of the virtual ground type array structure. That is, in the virtual ground type array structure, there is a possibility that a leakage current will flow in a direction of the bit line opposite to a flow of ordinary readout current into the source side from the bit line acting as the drain at the readout time and the readout characteristic of the memory cell will be degraded.

SUMMARY OF THE INVENTION

The present invention has been made in view of the above problems and an object thereof is to provide a non-volatile semiconductor memory device and an operating method therefor capable of effecting the programming operation and erasing operation at a low voltage.

Further object of this invention is to provide a non-volatile semiconductor memory device of virtual ground type array structure and an operating method therefor.

In order to attain the above objects, there is provided a non-volatile semiconductor memory device comprising memory transistors each of which includes buried diffusion layers arranged in parallel on a semiconductor substrate, used as source diffusion layers or drain diffusion layers and used as bit lines or source lines, a control gate used as a word line formed of polycrystalline silicon arranged in a direction perpendicular to the buried diffusion layers, a first insulation film formed in contact with the semiconductor substrate a part of which acts as a channel in an area in which a portion between the buried diffusion layers intersects the word line, a floating gate electrode formed on at least the first insulation film, and a second insulation film formed in an area in which the floating gate intersects the word line, the memory transistors being arranged in a matrix form on the semiconductor substrate surface with adjacent two of the memory transistors commonly using the buried diffusion layers; characterized in that:

a plurality of word lines are formed to intersect the buried diffusion layers and metal lines at right angles and one of the metal lines is arranged in parallel with the buried diffusion layers for every two buried diffusion layers to construct a unit block;

a metal line is connected to the drains of first and second block transistors via a contact, the sources thereof are connected to proximal ends of first and second buried diffusion layers, the distal ends of the first and second buried diffusion layers are respectively connected to the drains of third and fourth block transistors, and the source of the third block transistor is connected to the metal line to construct a first block;

the source of the third block transistor is connected to the source of a fourth block transistor of an adjacent second block and the source of the fourth transistor of the first block is connected to the source of third block transistor of an adjacent third block and to a metal line of the third block; and the buried diffusion layers of each block are made continuous to form a bellows-like pattern via the first to fourth block transistor of each block.

Further, an operating method for operating the above-mentioned non-volatile semiconductor memory device according to this invention is characterized by effecting:

a first step of applying a negative voltage to a word line connected to the control gate of the memory transistor to be selected and grounding said semiconductor substrate;

a second step of setting the first to fourth block transistors into an inoperative state;

a third step of applying a selection voltage to the control gate of one of the first and second block transistors via a selection line to select the buried diffusion layer acting as the drain of the memory transistor connected to the source of the selected block transistor; and a fourth step of applying a positive voltage to the metal line connected to the drains of the first and second block transistors, applying a positive voltage to the buried diffusion layer which is selected in the third step to set the drain of the to-be-selected memory transistor to a positive voltage and set the adjacent buried diffusion layer into the floating state; and a fifth step of effecting the writing operation by withdrawing charges stored in the floating gate of the to-be-selected memory transistor by an F–N tunnel current into the drain thereof.

Further, an operating method for operating the above-mentioned non-volatile semiconductor memory device according to this invention is characterized by effecting:

a step of applying a drain voltage to all of the metal lines from a first power supply as a standby state;

a step of selecting a word line acting as the control gate of a to-be-selected memory transistor;

a step of selecting the to-be-selected memory transistor according to a combination of the first and fourth block transistors or a combination of the second and third block transistors, applying a drain voltage of the same potential as that of the first power supply from a second voltage source to a metal line connected to the drain of the memory transistor and connecting the same to a sense amplifier in order to select the memory transistor; and a step of grounding a bit line connected to the source of the memory transistor; and reading out information stored in the memory transistor via a sense amplifier.

| Reference Number Table: | |
|---|---|
| 11, 11a, 11b, 11c | memory floating cell |
| 12 | floating gate |
| 13 | control gate |
| 13a | word gate |
| 14, 14a, 14b | buried diffusion layer (bit line) |
| 15, 15a, 15b | buried diffusion layer (bit line) |
| 16, 16a, 16b | metal line |
| 17, 17a, 17b | block transistor (BT) |
| 18, 18a, 18b | block transistor (BT) |
| 19, 19a, 19b | block transistor (BT) |
| 20, 20a, 20b | block transistor (BT) |
| 21 to 24 | selection line |
| 25, 25a, 25b | contact |
| 26, 16a, 26b | contact |

DETAILED DESCRIPTION OF PREFERRED EMBODIMENTS

One embodiment of a non-volatile semiconductor memory device and an operating method therefor according the is invention is explained with reference to the equivalent circuit of FIG. 1.

Figure 1:
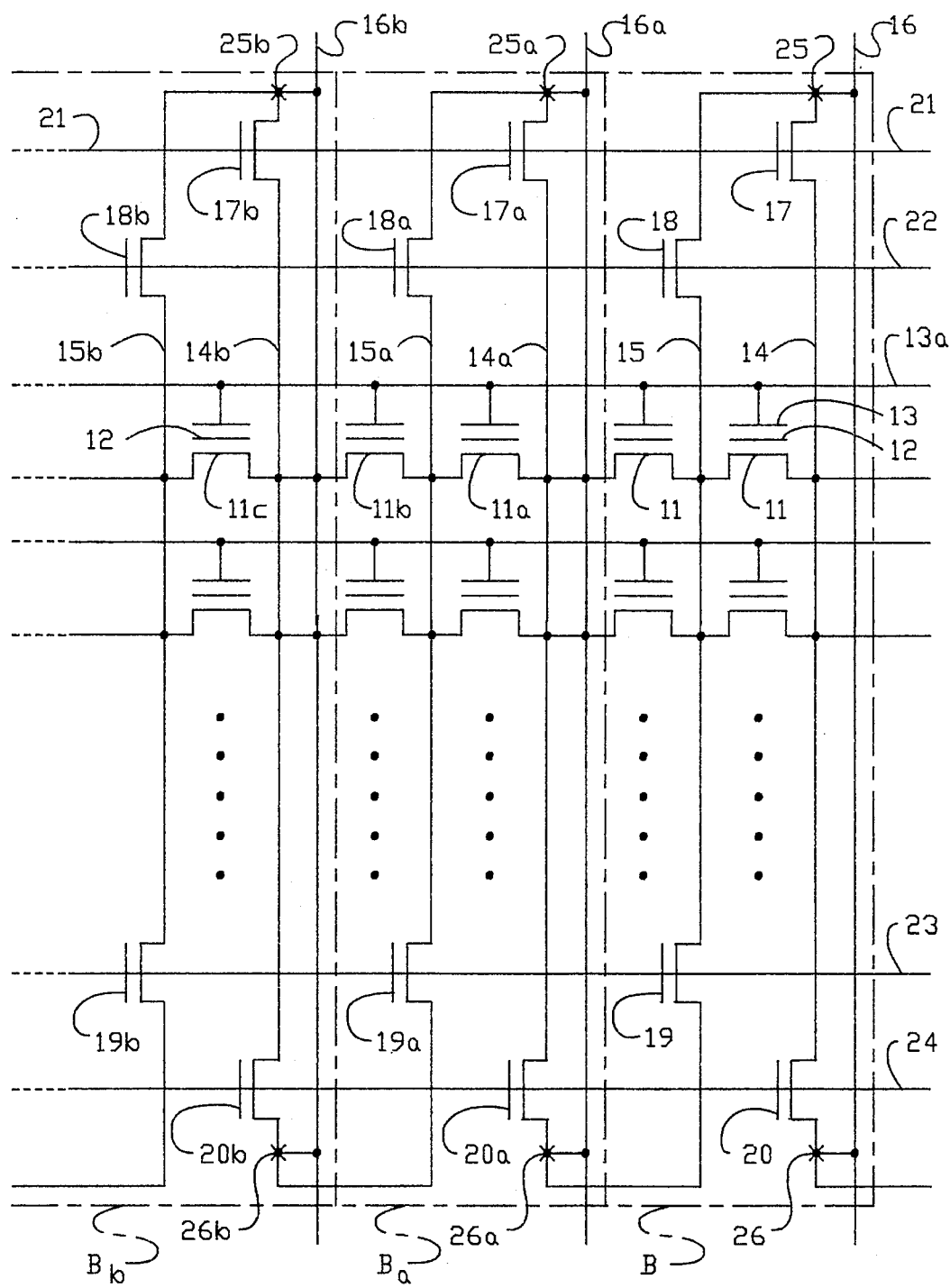
FIG. 1 is a diagram showing an equivalent circuit of a non-volatile semiconductor memory device shown in FIG. 2 according to this invention.

In FIG. 1, the reference numbers 11, 11a, 11b denote floating gate memory cells. Each memory cell includes a floating gate 12, a control gate 13 acting as a word line, and buried diffusion layers 14, 15 which are bit lines and function as drains or sources for the memory cells. One metal line 16 is arranged for the two buried diffusion layers 14 and 15, and the potential applied to the metal line 16 is selected by block transistors (which are hereinafter referred to as BTs) 17, 18, 19, 20, and applied to each of the buried diffusion layers 14,15, and a block B is constructed by a memory cell group.

The buried diffusion layer 14 is connected at one end to the source of the BT 17 and connected at the other end to the drain of the BT 20, the buried diffusion layer 15 is connected at one end to the source of the BT 18 and connected at the other end to the drain of the BT 19, and layers 14 and 15 can be selected by the BTs.

Further, the buried diffusion layers 14, 15 of each of the block B, Ba, Bb are connected via the BTs to form a bellows-like pattern and connected to the metal line via contacts. For example, a metal line 16a of FIG. 1. is connected to the drain of BTs 17a, 18a via a contact 25a in the upper portion of the block Ba, the sources thereof are connected to bitlines (buried diffusion layers) 14a, 15a, the bit line 14a is connected at its lower portion to the drain of the BT 20a, and the source thereof is connected to the metal line 16a via a contact 26a and to the source of the BT 19 of the adjacent block B. Further, the source of the BT 19a is connected to the metal line 16b and to the source of the BT 20b of the adjacent block Bb. The BTs 17, 18, 19, 20 are controlled by selection voltages applied to the selection lines 21, 22, 23, 24.

The symmetry of memory cells in the array structure is made such that the buried diffusion layers acting as the source and drain of each memory cell are so set that the adjacent memory cells will commonly use the diffusion layer and the arrangements of the drains and sources of respective memory cells will be all made in the same direction, and the programming can be made by a Fowler-Nordheim tunnel current only on one side of the source or drain. This is done for instance by asymmetrical source/drain implants, closer to the floating gate on the tunneling side than on the other. To accomplish this asymmetry, the implant step for the buried diffusion region is done with an ion beam slanted to one side, leaving a shadow near the floating gate on one side of the mask opening, but covering the other side completely.

Figure 2:
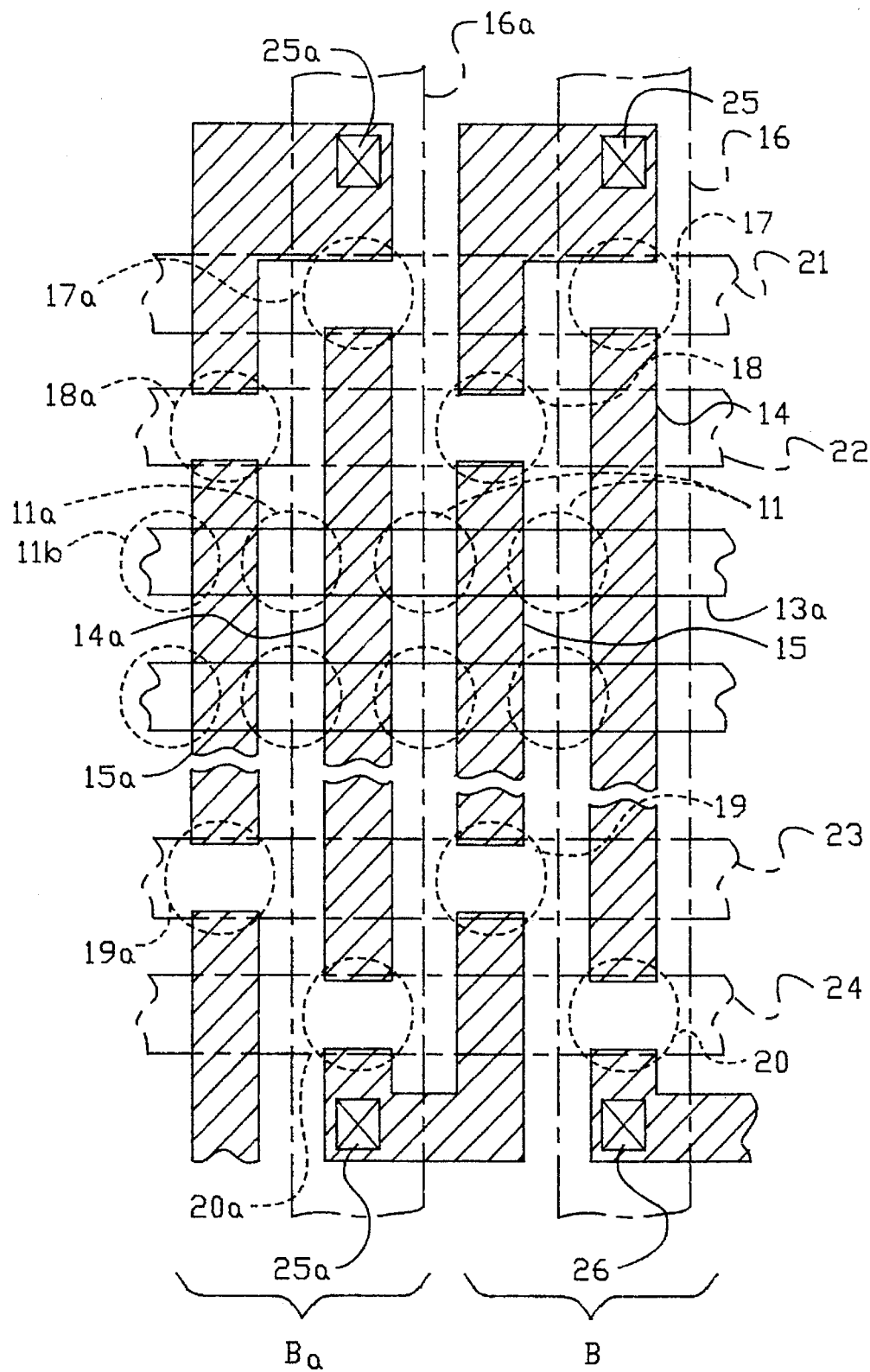
FIG. 2 is a diagram showing the arrangement of a non-volatile semiconductor memory device according to this invention.
Figure 3A:
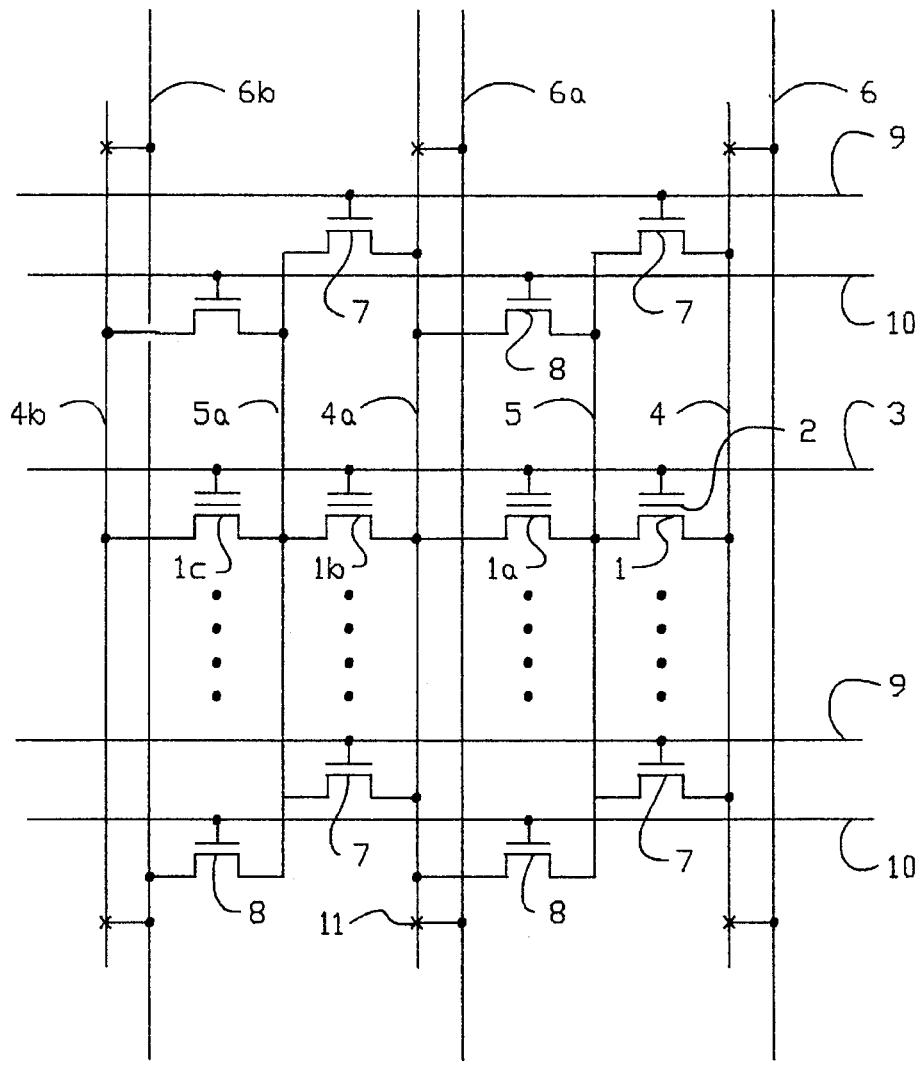
FIG. 3a is a diagram showing an equivalent circuit of a prior art conventional non-volatile semiconductor memory device.
Figure 3B:
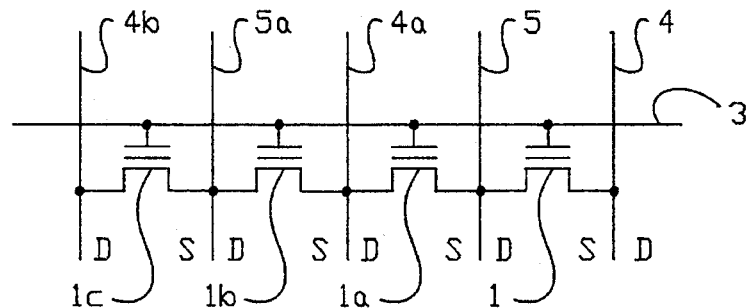
FIG. 3b is an equivalent circuit of a prior art symmetrical memory cell.

FIG. 2 is an arrangement diagram of the embodiment of FIG. 1 and the same symbols are attached to the same portions.

In FIG. 2, one block in which one metal line is arranged for two buried diffusion layers as one unit is repeatedly arranged, one end of the buried diffusion layer 14 forms the source of the BT 17 and the other end thereof forms the drain of the BT 20. Also, one end of the buried diffusion layer 15 acts as the source of the BT 18 and the other end thereof acts as the drain of the BT 19. The buried diffusion layers 14, 15 are connected to form a bellows-like pattern by the BTs 17, 18, 19, 20.

Gate insulation films are formed on those portions of the semiconductor substrate in which the buried diffusion layer 14, 15, 14a, 15a intersect with word lines 13a, floating gates are formed in contact with the gate insulation films, insulation films are formed on the surfaces of the floating gates, and control gates formed of conductive polysilicon layers or the like are formed and used as the word lines 13a to construct memory cells 11, 11a.

Figure 4A:
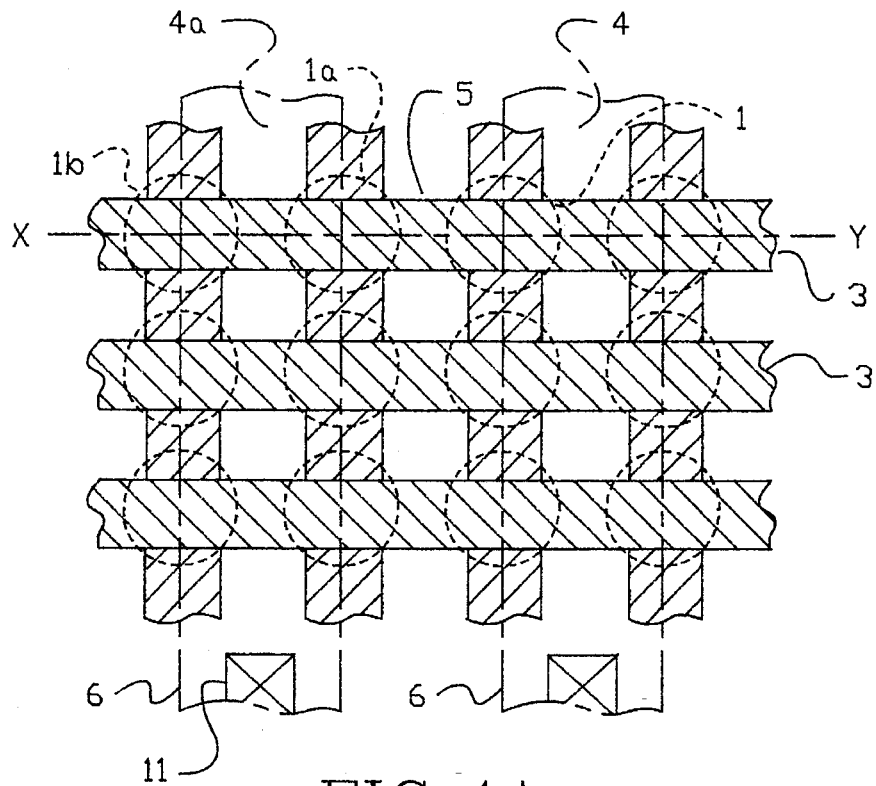
FIG. 4a shows the arrangement diagram of the prior art semiconductor memory device of FIG. 3.
Figure 4B:
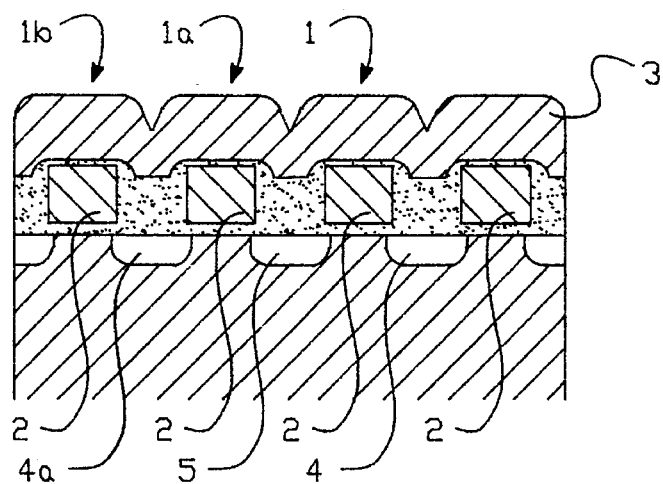
FIG. 4b is a cross sectional view taken along the lines X–Y in FIG. 4a of the prior art device.

Further, the cross sectional view taken along the word line 13a shows the cross section similar to FIG. 4b.

Next, the readout operation of the non-volatile semiconductor memory device of FIG. 1 is explained based on the equivalent circuit thereof.

In this embodiment, each memory device has the symmetry arrangement in which the bit line 14a functions as the drain and the bit line 15a functions as the source in the memory cell 11a. All of the other memories take the configuration obtained by moving the positional relation of the memory cell 11 in parallel. However, it is clear that the memory cell in the virtual ground array structure can be read out without maintaining the above symmetry.

When the memory cell is set in the standby state, that is, when it is set in a state in which the readout is not effected, a voltage at the readout time, for example, 1.2 V is applied to all of the metal lines 16, 16a. Assume that the voltage is $DV_o$. When the readout from the memory cell 11a is effected, the word line 13a is first selected and a power supply voltage of 5 V or 3 V is applied. In order to apply a potential at the readout time to the drain of the memory cell 11a, the metal line 16a is connected to the sense amplifier (not shown) and the voltage $DV_1$ which is the same potential as the voltage $DV_0$ is applied to the metal line 16a. The selection of line 21 is selected to apply the potential $DV_1$ only to the drain of the memory cell 11a. The selection line 22 is not selected. Further, in order to ground the source of the memory cell 11a, the selection line 23 is selected after the metal line 16b is grounded. The selection line 24 is not selected.

The voltage $DV_1$ applied to the metal line 16a under this condition is applied to the drain of the memory cell 11a via the BT 17a and the buried diffusion layer 14a which is a bit line and the source of the memory cell 11a is connected to the metal line 16b via the buried diffusion layer 15a and BT 19a and grounded. A readout current is caused to flow in the memory cell 11a according to the storage charge state of the floating gate of the memory cell 11a and the readout current is detected by the sense amplifier to determine "1" or "0".

Of course, when the readout from the memory cell 11a is effected, the control voltage is applied to the selection lines 21 and 23 and the transistors 17, 17a, 17b and 19, 19a, 19b which receive the voltage as the gate voltage are set into the ON state. The voltage $DV_1$ applied to the metal line 16a by the operation of the BT 19 is also applied to the bit line 15 which is adjacent to the bit line 14a of the drain of the memory cell 11a. The voltage $DV_0$ applied to metal line 16, and the voltage $DV_1$ applied to metal line 16A are the same, so no leakage current will flow of the metal line 16A to the memory cell 11.

The readout operation of the memory cell 11b can be effected by the same method of selection of the word line 13a and metal lines 16a, 16b as that used in the case of memory cell 11a. The selection lines 22, 24 are selected to select the BTs 18a, 20a and none of the selection lines 21, 23 are selected. The voltage $DV_1$ is applied to the metal line 16a is applied to the drain of the memory cell 11b via the transistor 18a and buried diffusion layer 15a, and the source of the memory cell 11b is connected to the metal line 16b which is grounded via the buried diffusion layer 14b and BT 20b. Since the other bit lines (other than the two bit lines applied with the voltage $DV_1$ and the two bit lines grounded) are applied with the voltage $DV_0$, a leakage current other than the readout current will not flow from the metal line 16a.

Since virtual ground array structure has the arrangement in which the structures each having one metal line connected to every two buried diffusion layers are repeatedly arranged, the readout can be effected in the same manner when the readout from the memory cell of the other block is effected.

Next, the programming operation of the embodiment of FIG. 1 is explained.

Like the explanation for the readout operation of the memory cell, the bit line 14a functions as a drain for the memory cell 11a, for example, and 15a functions as a source, and the other memory cells are arranged with the same symmetry.

In the virtual ground array structure, in order to program the memory cell, a negative voltage is applied to the gate, the semiconductor substrate is grounded, a positive power supply voltage is applied to one of the buried diffusion layers of the drain and source which is formed to permit flow of the Fowler-Nordheim tunnel current and the other is set into the floating state so that a high voltage can be applied between the drain and the gate oxide film and excessive electrons of the floating gate will be drawn into the buried diffusion layer to which the positive power supply voltage is applied as the Fowler-Nordheim tunnel current, thereby lowering the threshold value of the memory cell to effect the programming. In the following embodiment, a case wherein a Fowler-Nordheim tunnel current flows only on the drain side of the buried diffusion layers lying on both sides of the memory cell is explained.

The programming condition is explained with respect to the memory cell 11a.

First, the word line 13a is selected and a negative voltage is applied thereto. A power supply voltage is applied to the bit line 14a which is the drain end of the memory cell 11a, and in order to set the bit line 15a which is the source thereof into the floating state, a power supply voltage is applied to the metal line 16a and to line 21 to select the BT 17a. None of the other BTs 18a to 20a are selected. The bit line 14a is applied with the power supply voltage via the BT 17a from the metal line 16a and the bit line 15a is set into the floating state since the BTs 18a and 19a are OFF. The voltage of the bit line 14a is also applied to the adjacent memory cell 11, but since this lies on the source side of the memory cell 11, the charge state of the floating gate will not be disturbed.

At this time, all of the BTs 17, 17a belonging to the virtual ground array structure are selected. Therefore, the bit lines 14, 14a are connected to the metal lines 16, 16a via the BTs 17, 17a. Since the word line 13a is selected and a negative voltage is applied, it becomes possible to program the memory cells having the bit lines 14, 14a as the drains among the memory cells having the word line 13a as the control gates in a parallel fashion by randomly selecting the metal lines 16, 16a and applying a power supply voltage to the drains of the memory cells.

Further, when the memory cell 11b is selected, selection of the word line 13a and metal line 16a is effected in the same manner as described above and the selection line 22 is selected to set the BT 18a into the ON state. None of the other BTs are selected. A voltage applied to the metal line 16a is applied to the bit line 15a via the BT 18a and the bit lines 14, 14a are isolated since none of the BTs 17, 17a are selected. Also, since neither of the selection lines 21, 24 are selected, the source of the memory cell 11b for the bit line 14b is set into the floating state. At this time, like the above case, all of the memory cells using the bit lines 15, 15a as the drains can be programmed in parallel by randomly selecting the metal lines 16, 16a.

Further, as described with respect to the array structure, since the structure takes a configuration obtained by repeating the same structure in the unit of the two bit lines formed of buried diffusion layers, the method is not limited to the operating method of the above embodiment, and another operating method for selecting a memory cell can be easily attained.

In the above embodiment, an example in which the charge state of each memory cell is not disturbed even when the programming is effected only on the drain side and a voltage is applied to the source side, but it is clear that the non-volatile semiconductor memory device of virtual ground type array structure may function even when a memory cell which can be programmed only on the source side is used.

For example, the word line 13a is selected and a negative voltage is applied thereto in order to program the memory cell 11a. Only the selection line 22 among the selection lines for the BTs is selected, the BT 18a is set into the ON state, and no other selection lines are selected. A power supply voltage applied to the metal line 16a is supplied to the bit line 15a via the selected BT 18a to program the memory cell 11a. At this time, the memory cells using the bit lines 15, 15a, 15b as the sources among the memory cells using the word line 13a as the control gates can be simultaneously programmed.

Further, the reason why the selection line 21 is selected instead of the selection line 22 among the control gates of the BTs when the memory cells including the memory cell 11b using the bit line 14, 14a as the sources are programmed is the same as that in a case wherein the programming is effected on the drain side thereof and the explanation therefor is omitted.

Next, the erasing operation of the embodiment of FIG. 1 is explained.

In the memory cell of virtual ground type array structure, the erasing state is determined by storing charges in the floating gate to enhance the threshold value of the memory cell. Therefore, the erasing state is set by applying a positive high voltage to all of the word lines for the memory cells set in the programmed state having a low threshold value and applying a ground or negative voltage to the semiconductor substrate and buried diffusion layers to apply a high voltage between the floating gate and the semiconductor substrate, thereby causing electrons to be injected by the tunnel current from the semiconductor substrate into the floating gate and enhancing the threshold value of the memory cell. This operation can be simultaneously effected for all of the memory cells on the chip or all of the memory cells in the block and thus the function of the flash memory can be attained.

As described above, this invention is a virtual ground type flash memory array in which two bit lines formed of buried diffusion layers commonly use one metal line and has the structure and operating method therefor by use of memory cells which can utilize the Fowler-Nordheim tunnel current for both of the programming and erasing operations. The structural feature lies in the BTs arranged on both sides of each bit line (buried diffusion layer) and each bit line can be independently controlled by selecting the predetermined BT. Therefore, it has an advantage that the virtual ground type flash memory array integrated with high density can be operated on a low voltage.

Further, each bit line formed of the buried diffusion layer is controlled by the BT to determine whether a voltage is applied or not, and since every other bit line can be controlled by operating two types of BTs provided at the upper and lower ends of the bit line, it becomes possible to separately apply potentials to the two buried diffusion layers by use of one metal line.

Further, an independent potential can be applied to the drain and source of the memory structure at the readout time by operating the two buried diffusion layers connected to one metal line with the layers shifted by one at the upper and lower ends of the block.

Further, according to the array structure, there is an advantage that a readout method for a memory cell without causing a leakage current can be realized without sacrificing the readout speed. That is, a readout potential of the drain is applied to each metal line to set the standby state in this invention. As a result, an advantage that a leakage current from the drain at the readout time can be prevented and degradation in the readout speed can be prevented is provided.

Further, according to this array structure, every other bit line, which are half of the number of the bit lines in the array, can be selected by selecting none of the block transistors at the lower end of the block and selecting one of the two block transistors at the upper end. Since each of the memory cells in the array can be programmed only at the end of one of the drain and source it becomes possible to select one word line, apply a negative voltage thereto, and program every other memory cell (half of the memory cell using the above word line as the control gates) and which use the bit lines set in the selectable state as the programmable ends. The memory cells can be randomly and simultaneously programmed according to data to be stored. Further, there is an advantage that the remaining half number of memory cells among the memory cells using the above word line as the control gates can be programmed by merely selecting the remaining ones among the BTs at the upper end of the block.

As described above, according to the non-volatile semiconductor memory device and the operating method therefor of this invention, while an advantage that the memory cells can be formed with high density is kept, an advantage that the programming and writing operations can be made flexible without causing a leakage current between adjacent memory cells can be provided and a virtual ground type flash memory array can be provided.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A non-volatile semiconductor memory device comprising buried diffusion layers arranged in parallel on a semiconductor substrate, the buried diffusion layers used as source diffusion layers or drain diffusion layers and used as bit lines or source lines, word lines formed of polycrystalline silicon arranged in a direction perpendicular to said buried diffusion layers, a first insulating film formed in contact with said semiconductor substrate, floating gates on the first insulating film under which the semiconductor substrate includes channels, and a second insulation film between said floating gates and said word lines, such that memory cell transistors are arranged in a matrix form on said semiconductor substrate with adjacent pairs of said memory cell transistors on a single word line sharing a buried diffusion layer; the non-volatile semiconductor memory device characterized by:

a plurality of metal lines including one metal line arranged in parallel with said buried diffusion layers for every two buried diffusion layers to construct unit blocks;

a unit block including first and second block transistors, having respective sources and drains, the metal line of said unit block connected to the drains of the first and second block transistors, the sources of the first and second block transistors connected to proximal ends of first and second buried diffusion layers in said unit block;

third and fourth block transistors, having respective sources and a drains, the drains of third and fourth block transistors connected to respective distal ends of said first and second buried diffusion layers in said unit block, the source of said third block transistor connected to said metal line of said unit block;

the source of said third block transistor of said unit block connected to the source of a fourth block transistor of a first adjacent unit block on one side of said unit block, the source of said fourth block transistor of said unit block connected to the source of a third block transistor of a second adjacent unit block on another side of said unit block and to a metal line of the second adjacent unit block;

such that said buried diffusion layers of the unit blocks are connected in a bellows configuration via said first to fourth block transistors.

2. A non-volatile semiconductor memory device according to claim 1, characterized by resources which execute:

a first step of applying a negative voltage to a word line connected to the control gate of a selected memory transistor and grounding said semiconductor substrate;

a second step of setting said first to fourth block transistors into an inoperative state;

a third step of applying a selection voltage to the control gate of one of said first and second block transistors via a selection line to select the buried diffusion layer acting as the drain of the memory transistor and connected to the source of the selected block transistor; and a fourth step of applying a positive voltage to the metal line connected to the drains of said first and second block transistors, to apply a positive voltage to the buried diffusion layer which is selected in said third step to set the drain of said selected memory transistor to a positive voltage, leaving the adjacent buried diffusion layer in a floating state;

thereby effecting a writing operation by withdrawing charge stored in the floating gate of said selected memory transistor by Fowler-Nordheim tunnel current into the drain thereof.

3. A non-volatile semiconductor memory device according to claim 1, characterized by resources which execute:

a step of applying a drain voltage to the plurality of metal lines from a first power supply as a standby state;

a step of selecting a word line acting as the control gate of a selected memory transistor;

a step of accessing said selected memory transistor according to a combination of said first and fourth block transistors or said second and third block transistors, applying a drain voltage of the same potential as that of the first power supply from a second voltage source to a metal line connected to the drain of the selected memory transistor and connecting the metal line to a sense amplifier; and a step of grounding a buried diffusion line connected to the source of said memory transistor; and reading out information stored in said selected memory transistor via said sense amplifier.

* * * * *